(12) United States Patent
Duvvury et al.

(10) Patent No.: US 6,833,568 B2
(45) Date of Patent: Dec. 21, 2004

(54) GEOMETRY-CONTROLLABLE DESIGN BLOCKS OF MOS TRANSISTORS FOR IMPROVED ESD PROTECTION

(75) Inventors: Charvaka Duvvury, Plano, TX (US); Kwang-Hoon Oh, Seoul (KR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/389,354

(22) Filed: Mar. 13, 2003

(65) Prior Publication Data

US 2004/0178453 A1 Sep. 16, 2004

(51) Int. Cl.[7] .......................... H01L 29/74; H01L 23/62
(52) U.S. Cl. ...................... 257/173; 257/360; 257/365; 257/355; 257/356
(58) Field of Search ................................ 257/173, 360, 257/365, 355, 356, 174, 359, 363, 358, 361, 362, 367

(56) References Cited

U.S. PATENT DOCUMENTS 5,998,832 A * 12/1999 Sheu et al. .................. 257/327
6,373,109 B1 * 4/2002 Ahn ........................... 257/384
6,465,768 B1 * 10/2002 Ker et al. ................. 250/214.1
2003/0052367 A1 * 3/2003 Lin ............................ 257/355

* cited by examiner

*Primary Examiner*—Minhloan Tran
*Assistant Examiner*—Tan Tran
(74) *Attorney, Agent, or Firm*—W. James Brady, III; Frederick J. Telecky, Jr.

(57) ABSTRACT

An MOS transistor in the surface of a semiconductor substrate (180) of a first conductivity type, which has a grid of isolations (171) in the surface, each grid unit surrounding a rectangular semiconductor island (102). Each island contains three parallel regions of the opposite conductivity type: the center region (104) is operable as the transistor drain and the two other regions (103 and 105), abutting the isolations, are operable as transistor sources. Transistor gates (106 and 107) are between the parallel regions, completing the formation of two transistors having one common drain. Electrical contacts (108) are placed on both source regions and the drain region. The source contacts are placed so that the spacing (120) between each contact and its respective isolation is at least twice as large as the spacing (121) between each contact and the gate. A plurality of these islands are interconnected to form a multi-finger MOS transistor having increased ESD failure threshold current by spreading the power dissipation and thus reducing the current localization without impacting the drain-to-substrate capacitance.

10 Claims, 4 Drawing Sheets

GEOMETRY-CONTROLLABLE DESIGN BLOCKS OF MOS TRANSISTORS FOR IMPROVED ESD PROTECTION

The present filing is related to filing TI-36067 "Spreading the Power Dissipation in MOS Transistors for Improved ESD Protection".

FIELD OF THE INVENTION

The present invention is related in general to the field of electronic systems and semiconductor devices and more specifically to the layout of multi-finger MOS transistors aiming at ESD protection.

DESCRIPTION OF THE RELATED ART

Integrated circuits (ICs) may be severely damaged by electrostatic discharge (ESD) events. A major source of ESD exposure to ICs is from the human body (described by the "Human Body Model", HBM); the discharge of the human body generates peak currents of several amperes to the IC for about 100 ns. A second source of ESD is from metallic objects (described by the Machine model", MM); it can generate transients with significantly higher rise times and current levels than the HBM ESD source. A third source is described by the "charged device model" (CDM), in which the IC itself becomes charged and discharges to ground in rise times less than 500 ps.

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an nMOS device whose drain is connected to the pin to be protected and whose source is tied to ground. The protection level or failure threshold can be set by varying the nMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism, found in the nMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak nMOS device temperature, at which second breakdown is initiated, is known to increase with the stress current level.

It is well known that for non-silicided or silicide-blocked nMOS transistors, the second breakdown trigger current (It2), which is widely used as an ESD strength monitor, can be increased with larger drain contact spacings because of more uniform triggering of the lateral npn structure, due to ballast resistance effects. In addition, it is also well established that effectiveness is much reduced in the case of devices with silicided diffusions, since the ballast resistance is insufficient, making the devices susceptible to current localization, which leads to early ESD failure. In silicided cMOS devices, the primary cause of the degradation of ESD failure threshold is known to be non-uniform bipolar conduction, which is attributed to insufficient ballasting resistance in the fully silicided source/drain structures. This decrease in ESD strength imposes severe restrictions on the efficient design of ESD protection. Known options for correcting this shortcoming either require an extra mask or more process complexity, resulting in increased process cost and chip real estate.

An urgent need has therefore arisen for cost effective design methods to achieve advanced ESD protection, compatible with uniform turn-on, high response speed, low capacitance and low leakage current using standard CMOS processing. The device structures should further provide excellent electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

One embodiment of the invention is an MOS transistor in the surface of a semiconductor substrate of a first conductivity type, which has a grid of isolations in the surface, each grid unit surrounding a rectangular substrate island. Each island contains three parallel regions of the opposite conductivity type: the center region is operable as the transistor drain and the two outer regions, abutting the isolations, are operable as transistor sources. Transistor gates are between the parallel regions, completing the formation of two transistors having one common drain. Electrical contacts are placed on both source regions and the drain region. A plurality of these islands is interconnected to form a multi-finger MOS transistor.

Another embodiment of the invention has the source contacts placed so that the spacing between each contact and its respective isolation is at least twice as large as the spacing between each contact and the gate. The spacings are selected to increase the failure threshold current of the multi-finger MOS transistor by spreading the power dissipation and thus reducing the current localization, whereby the protection of the transistor against ESD pulses is improved.

It is a technical advantage of this embodiment that the drain-to-substrate capacitance is not impacted.

In another embodiment of the invention, a first guard ring is connected to the substrate. The guard ring couples conductively the transistor gates of a plurality of the islands, thus defining a multi-finger transistor in a block operable to turn-on as a single unit in case of an ESD pulse.

In another embodiment of the invention, a plurality of the blocks, spaced by a distance less than 5 $\mu$m, is surrounded by a second guard ring electrically connected to ground potential and spaced from the first guard rings by a distance less then 10 $\mu$m. It is a technical advantage of this embodiment that the second guard ring is operable to enforce equal substrate biasing for all the transistor fingers and transistor blocks to insure uniform turn-on in case of an ESD pulse.

Embodiments of the present invention are related to advanced deep submicron technology devices with shallow trench isolation, especially salicided nMOS transistors. Such transistors are for instance employed in wireless devices, or in Application Specific products, or in mixed signal and logic devices.

A technical advantage of the invention is its simplicity so that it can easily be adopted into any integrated circuit design methodology.

Another technical advantage of the invention is that it may be implemented using standard semiconductor processing techniques. For ESD protection circuitry, as well as for general equalization needs, no additional processing time or expense to the integrated circuit is needed.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

For silicided technologies, contact-to-gate spacing does not increase the ballast resistance and hence does not improve the ESD robustness for nMOS protection designs. However, for advanced deep submicron technologies, it has been found that source and drain contact-to-gate spacings improve It2. The mechanisms responsible for this improvement are decreased current crowding and improved heat-dissipating volume. Spacing to the surrounding isolation gives an additional boost to It2.

Figure 1A:
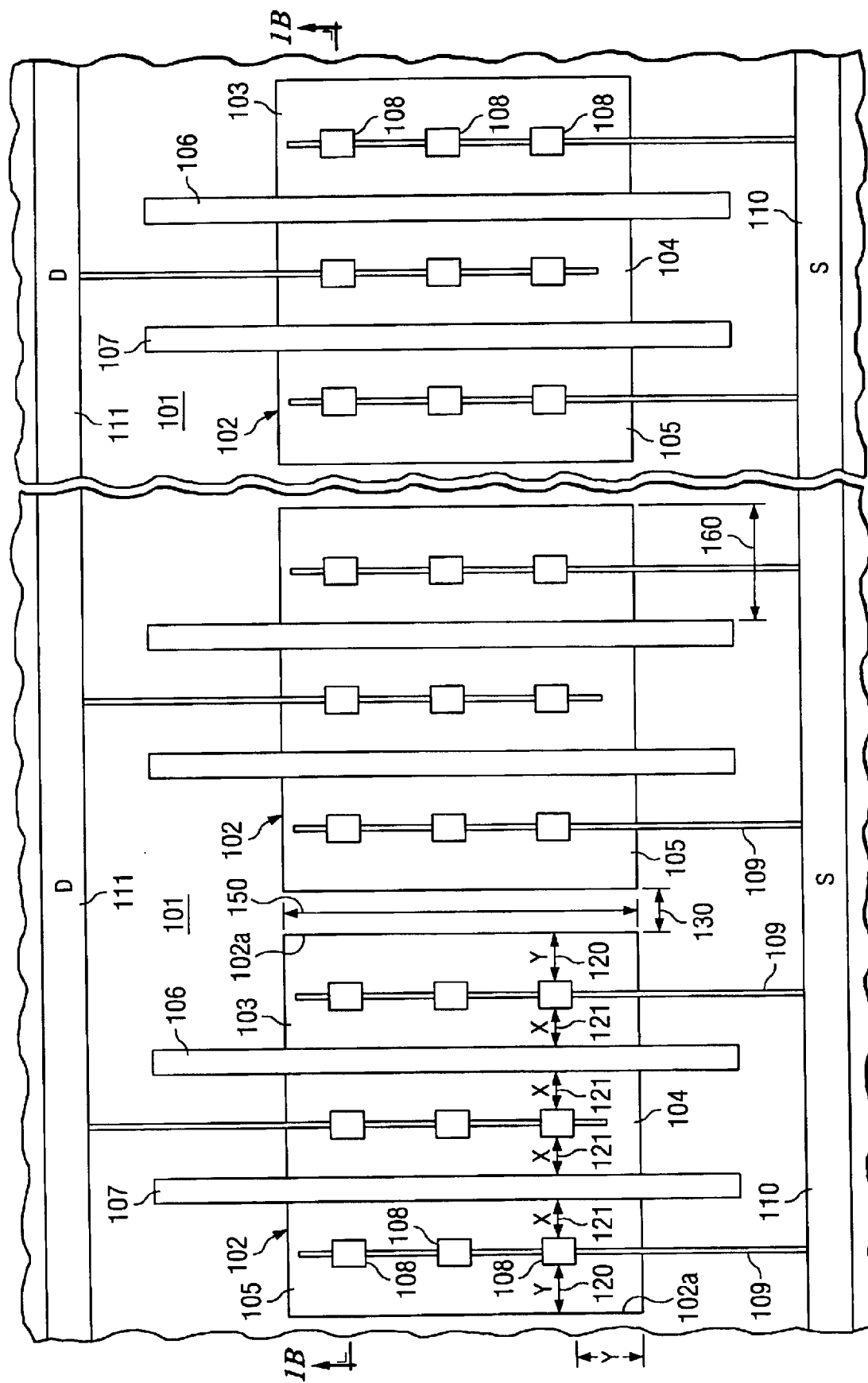
FIG. 1A is a schematic and simplified top view of an embodiment of the invention depicting transistor segments placed in islands formed by insulators.

FIG. 1A illustrates a schematic top view of an embodiment of the invention. On the surface of a semiconductor substrate of a first conductivity type is an insulator grid 101 laid out so that the insulator surrounds a plurality of rectangular openings 102. The conductivity type of the substrate can be n-type or p-type; the insulator may be a shallow trench isolation or some other field isolation. Each opening is an island in which semiconductor material, forming a transistor, is exposed. Each island contains three parallel regions 103, 104, and 105 of the opposite conductivity type. The center region 104 is operable as the transistor drain. The other two regions 103 and 105 are operable as transistor sources. Regions 103 and 105 are abutting insulator 101. As shown in more detail in FIG. 1B, each region is silicided.

FIG. 1A indicates that between the parallel regions of sources and drain are transistor gates. Gate 106 is between source 103 and drain 104, and gate 107 is between source 105 and drain 104. Island 102 thus contains two transistor segments consisting of two sources and one shared drain. A plurality of electrical contacts is placed on both source regions 103 and 105 and the drain region 104. FIG. 1A illustrates three contacts 108 per region. The contacts of each region are interconnected by conductive lines 109 and combined to conduction busses. In FIG. 1A, bus line 110 is the source conductor, and bus line 111 is the drain conductor.

Each island provides improved It2 characteristics due to decreased current crowding and improved volume for thermal heating. Further, the layout of FIG. 1A provides a plurality of islands 102 with a common bus line 110 for all source regions and a common bus line 111 for all drain regions. The plurality of islands is thus interconnected to form a finger-shaped MOS transistor with overall improved It2 characteristics. In the layout of FIG. 1A, the distance 130 between adjacent islands is kept small (less than 1 $\mu$m).

An additional significant boost to failure threshold current It2 can be obtained by an embodiment of the invention wherein the spacings 120 between the source contacts 108 and the respective island walls 102a of the insulator 101 are selected to be at least twice as large as the spacings 121 between each contact 108 and the gate 106. This embodiment can be fully exploited in the design of FIG. 1A, since every source region is positioned adjacent to an insulator. According to the invention, the source contact to insulator spacing 120 can be selected to increase It2, since this spacing 120 enables spreading of the power dissipation and thus reduces the current localization. It should be stressed that dimension 120 has no impact on the drain-to-substrate capacitance. The source contact to gate spacing 121 is kept at about two times the minimum for the device design rule. Similarly, the drain contact to gate spacings (also denoted "x" in FIG. 1A) are kept at about two times the minimum for the device design rule.

In an embodiment of the invention, where the multi-finger MOS transistor is intended as an output buffer device, the spacing 120 can be designed to support low drain-to-substrate capacitance and thus increased speed of the device.

Out of the many silicon technologies and device designs for which the invention is applicable, the ESD protection transistor dimensions in the 0.13 $\mu$m technology may be quoted as an example. In the source region 105, the contact spacing 120 from the insulator wall 102a is 1.0 $\mu$m, while the contact spacing 121 from the gate 107 is 0.5 $\mu$m. In contrast, for regular transistors in this technology node, spacings 120 and 121 would be 0.1 $\mu$m, and the narrow dimension 160 of the source region is 0.15 $\mu$m. The insulator separation 130 between islands is 0.2 $\mu$m.

Figure 1B:
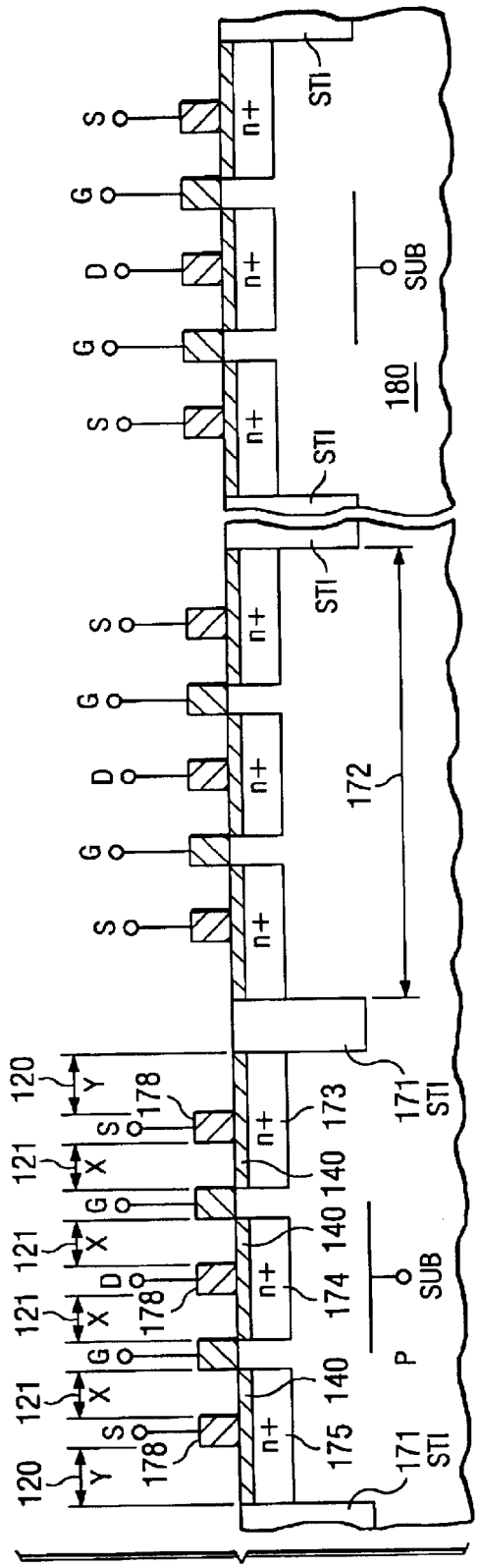
FIG. 1B illustrates a schematic cross section of the transistor islands and circuitry of the embodiment depicted in FIG. 1A.

FIG. 1B shows a schematic cross section of the insulator grid 171 and the plurality of transistor islands 172 of the embodiment corresponding to the top view of FIG. 1A. In the design example of FIG. 1B, the semiconductor substrate 180 of the first conductivity type is p-type, and the source regions 173 and 175, and the drain region 174 in each island are n+ type. As indicated in FIG. 1B, the source and drain regions are silicided with layer 140 (for example, CoSi2) (actually, but not shown in FIG. 1B, all gates are silicided as well). Not shown in FIG. 1B are the gate oxide layers, preferably 2.7 nm thick for 1.5 V nMOS transistors, and 7.0 nm thick for 3.3 V nMOS transistors. As depicted in FIG. 1B, source contacts 178 have a spacing 120 from the adjacent insulator wall, which is larger than the contact-to-gate spacing 121. In the preferred embodiment, spacing 120 is at least twice as large as spacing 121. Spacing 121 (and the drain contact to gate spacings) are kept at about two times the minimum for the device design rule.

FIG. 1B shows electrical connections for source, gate, drain, and substrate; however, the interconnections, for instance of the source contacts, are not shown.

Figure 2B:
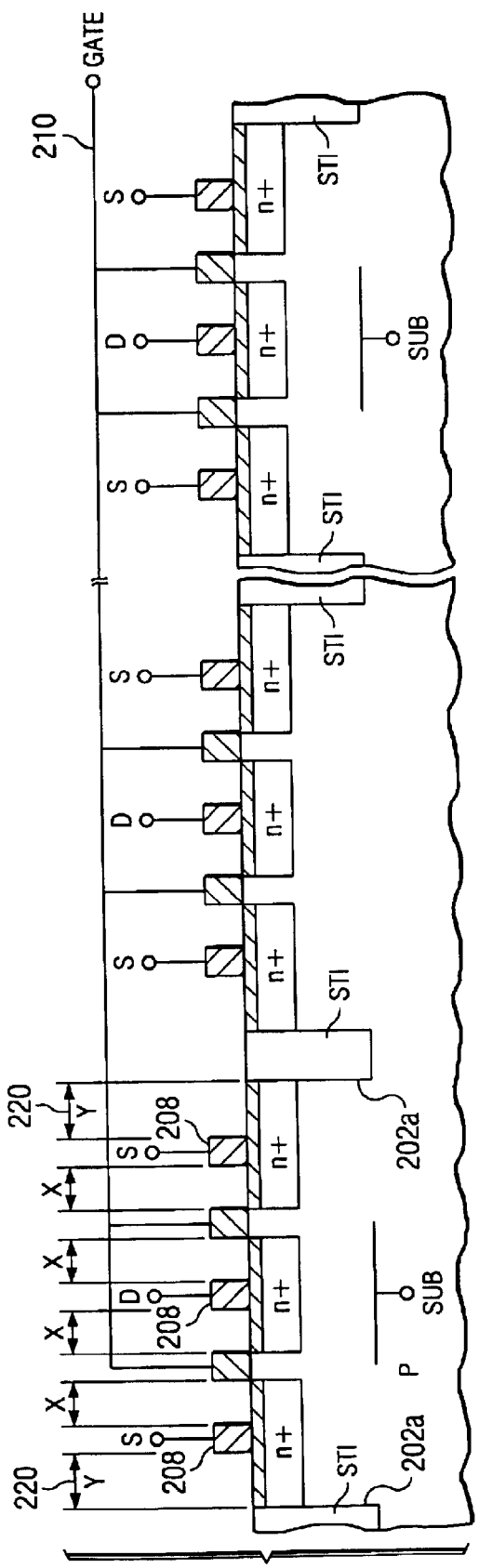
FIG. 2B illustrates a schematic cross section of the transistor islands and circuitry of the embodiment depicted in FIG. 2A.
Figure 2A:
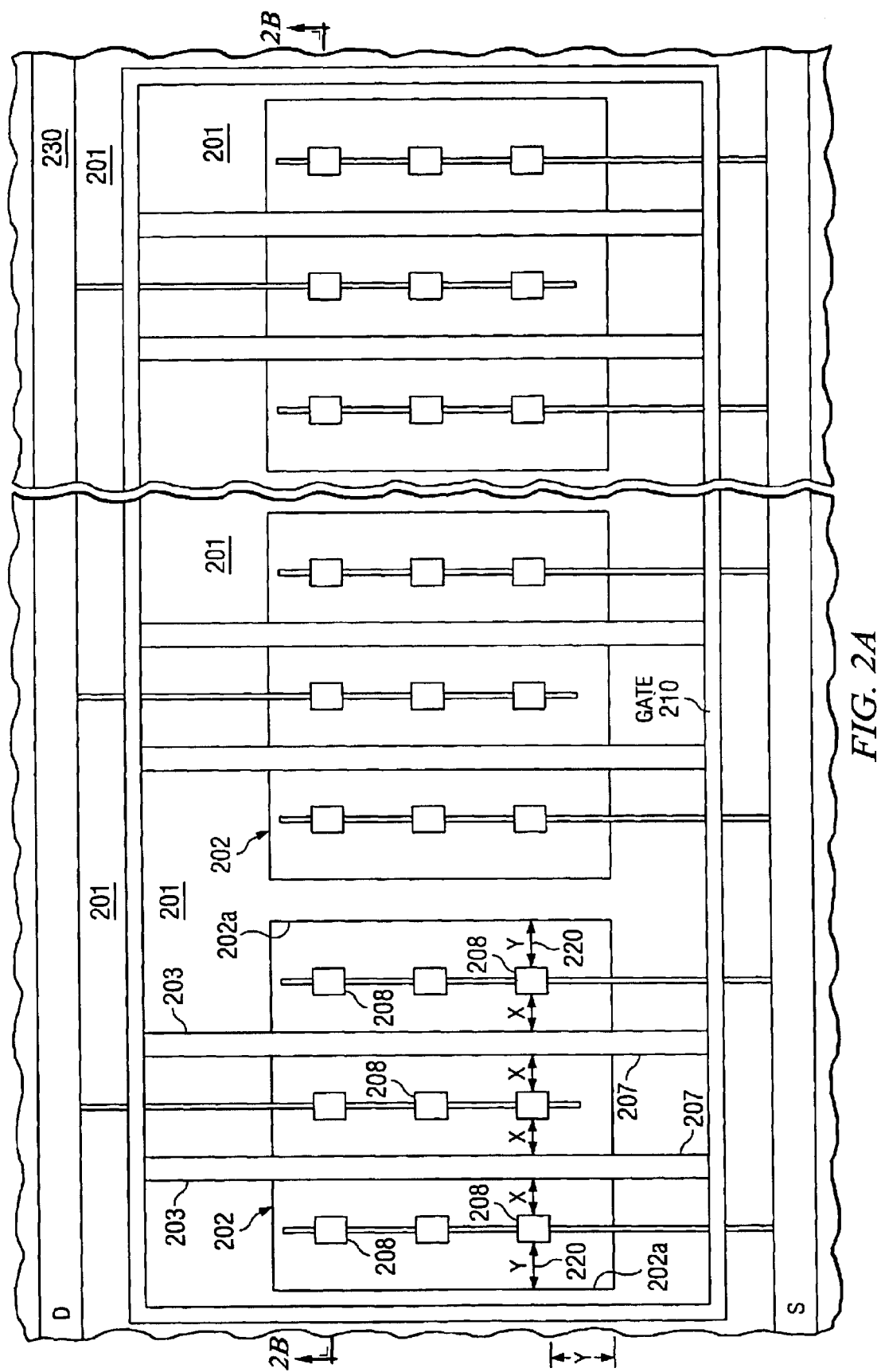
FIG. 2A is a schematic and simplified top view of another embodiment of the invention wherein a guard ring conductively couples the transistor gates of a plurality of islands, defining a multi-finger transistor block.

The schematic top view of FIG. 2A illustrates another embodiment of the invention. The grid of insulator 201 and the transistor islands 202 are laid out similar to FIG. 1A. In addition, FIG. 2A shows first guard ring 210, covered with poly/metal/contact, strapped to the gates. The gates 203 of the transistors in the plurality of islands 202 are thus capacitively coupled to the p+ ring. The plurality of transistors surrounded by guard ring 210 thus defines a multi-finger transistor in a "block", indicated by the dashed line 230. The block of transistors is operable to turn-on as a single unit in case of an ESD pulse.

FIG. 2B indicates the first guard ring 210 as an electrical interconnection of the transistor gates. In the example of FIG. 2B, this guard ring is p+. The guard ring is resistively connected to substrate ("floating").

Both FIGS. 2A and 2B incorporate the embodiments for ESD robustness discussed in FIGS. 1A and 1B. Preferably, the spacing 220 between source contact 208 and isolation wall 202a is at least twice as large as the spacing between each contact 208 and transistor gate 207.

Figure 3:
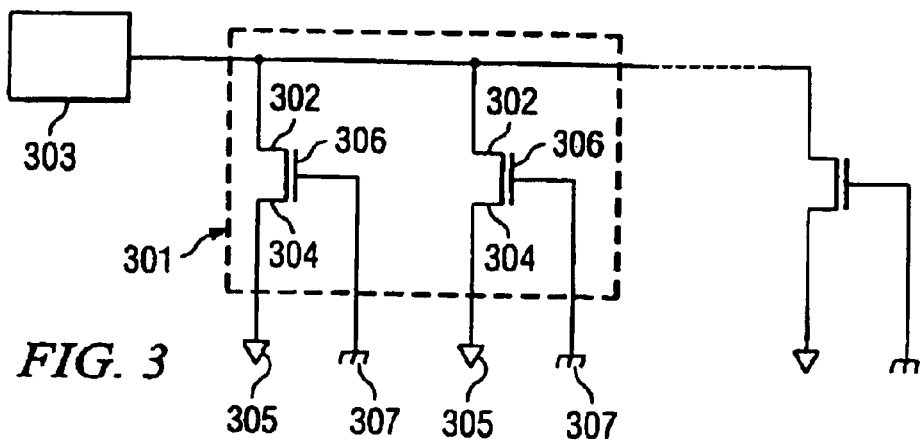
FIG. 3 is a schematic circuit diagram of the embodiment depicted in FIGS. 2A and 2B.

FIG. 3 is a block diagram of the embodiment illustrated in FIGS. 2A and 2B. A plurality of protection nMOS transistors is grouped in pairs 301, each pair being located in a semiconductor island of a insulator grid. The drain 302 of each transistor is connected to pad 303, resulting in an effective drain width, for example, of 80 μm. The transistor sources 304 are connected to ground potential 305. The transistor gates 306 are strapped to a floating p+ guard ring forming a gate-substrate connection (substrate 307). With the gates coupled to substrate, uniform multi-finger trigger can be achieved without substrate bias. This method is even more effective with substrate bias.

Figure 4:
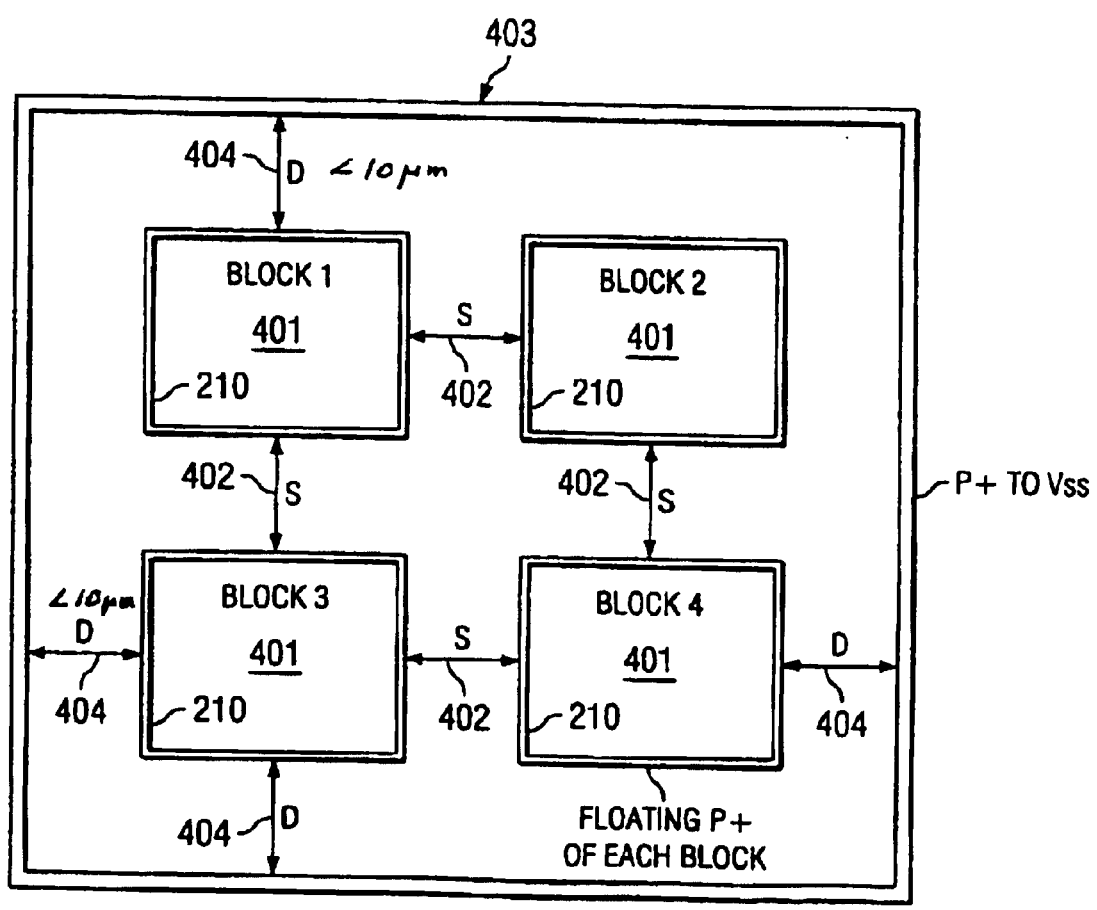
FIG. 4 is a schematic and simplified top view of yet another embodiment of the invention wherein a second guard ring surrounds a plurality of transistor blocks as defined in FIG. 2A.

FIG. 4 is a schematic and simplified top view of another embodiment of the invention. Four "blocks" 401 as defined by the outline 230 in FIG. 2A are grouped together, having a spacing 402 for example of <5 μm from each other. This group of blocks is surrounded by a second guard ring 403, having a spacing 404 for example of <10 μm from the blocks. This second guard ring 403 is also p+ (like the first guard rings 210 surrounding each block), yet electrically connected to ground potential, Vss. Second guard ring 403 operates to prevent latch-up.

It should be stressed that the concepts of these embodiments are applicable to any MOS (n type or p type) protection device for input pins, output pine, or power pins (Vdd), as well as to self-protection of output devices.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the embodiments are effective in pMOS transistors as well as in nMOS transistors to create ESD protection. As another example, the substrate material may include silicon, silicon germanium, gallium arsenide and other semiconductor materials employed in manufacturing. As yet another example, the concept of the invention is effective for many technology nodes and not restricted to a particular one. It is therefore intended that the appended claims encompass any such modifications or embodiments.

What is claimed is:

1. An MOS transistor in the surface of a semiconductor substrate of a first conductivity type, comprising:
   a plurality of isolations in said surface, each isolation surrounding a semiconductor island;
   each island containing three parallel regions having conductivity type opposite that of the semiconductor substrate, the center tregion operable as the transistor drain and the two other regions, abutting said isolations, operable as transistor sources;
   transistor gates between said parallel regions, completing the formation of two transistors having one common drain;
   electrical contacts placed on both of said source regions and said drain region, the spacing between each source contact and its respective isolation being at least twice as large as the spacing between each source contact and said gate; and
   a plurality of said islands interconnected to form a multi-finger MOS transistor.

2. The transistor according to claim 1 wherein said isolation is a shallow trench isolation or some other field isolation.

3. The transistor according to claim 1 wherein the surface of each source and drain region having conductivity type opposite that of the semiconductor substrate is silicided.

4. The transistor according to claim 1 wherein said spacings are selected to increase the failure threshold current of said multi-finger MOS transistor by spreading the power dissipation and thus reducing the current localization, whereby the protection of said transistor against ESD pulses is improved without impacting the drain-to-substrate capacitance.

5. The transistor according to claim 1 wherein said spacings are selected to provide low capacitance and thus speed for said multi-finger MOS transistor as an output buffer device.

6. The transistor according to claim 1 wherein said source contacts and the contacts placed on said drain form minimum spacings to said gates.

7. The transistor according to claim 1 further comprising a first guard ring connected to said substrate, said guard ring conductively coupling the transistor gates of a plurality of said islands, thus defining a multi-finger transistor in a block operable to turn-on as a single unit in case of ESD pulse.

8. The transistor according to claim 7 further comprising a plurality of said blocks, spaced by a distance Less than 5 μm and surrounded by a second guard ring electrically connected to ground potential and spaced from said first guard ring by a distance less then 10 μm said second guard ring operable to enforce equal substrate biasing for all said transistor fingers to insure uniform turn-on in case of ESD pulse.

9. The transistor according to claim 1 wherein said first conductivity type of said semiconductor substrate is p-type.

10. The transistor according to claim 1 wherein said First conductivity type of said semiconductor substrate is n-type.

* * * * *